(12) United States Patent
Tsai

(10) Patent No.: US 7,728,388 B1
(45) Date of Patent: Jun. 1, 2010

(54) POWER SEMICONDUCTOR DEVICE

(75) Inventor: Min-Hsuan Tsai, Tainan County (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 12/339,057

(22) Filed: Dec. 19, 2008

(51) Int. Cl.
*H01L 29/94* (2006.01)
(52) U.S. Cl. .................. 257/378; 257/343; 257/346
(58) Field of Classification Search ......... 257/343–346, 257/378, 565, 577
See application file for complete search history.

(56) References Cited

U.S. PATENT DOCUMENTS 6,172,401 B1 * 1/2001 Brand .................. 257/344

* cited by examiner

*Primary Examiner*—Zandra Smith
*Assistant Examiner*—Paul E Patton
(74) *Attorney, Agent, or Firm*—Winston Hsu

(57) ABSTRACT

A power semiconductor device includes a P type silicon substrate; a deep N well in the P type silicon substrate; a P grade region in the deep N well; a $P^+$ drain region in the P grade region; a first STI region in the P grade region; a second STI region in the P grade region, wherein the first and second STI region isolate the $P^+$ drain region; a third STI region in the deep N well; a gate electrode overlying an area between the second and third STI regions and covering a portion of the second STI region; a gate dielectric layer between the gate electrode and the P type silicon substrate; a P well formed at one side of the third STI region; and a $P^+$ source region in the P well.

17 Claims, 2 Drawing Sheets

POWER SEMICONDUCTOR DEVICE

BACKGROUND OF THE INVENTION

1. Field of the Invention

The present invention relates to a semiconductor device having an IGBT (Insulated Gate Bipolar Transistor), and more particularly to a power semiconductor device integrating an LDMOS (lateral double-diffused metal oxide semiconductor) device with a lateral IGBT, which is fully compatible with CMOS process employing bulk silicon substrate.

2. Description of the Prior Art

Controllers, memories, circuits of low-voltage operation and power devices of high-voltage operation have been largely integrated together to achieve a single-chip system. The power device, such as vertical double-diffusion metal-oxide-semiconductor (VDMOS), insulated gate bipolar transistor (IGBT) or lateral diffusion MOS (LDMOS), has been employed to increase power switching efficiency and decrease the loss of energy resources. It is often required that the switching transistors withstand high breakdown voltages and operate at a low on-resistance.

Double diffuse drain (DDD) technology has been extensively applied to the source/drain (S/D) in order to provide a higher breakdown voltage. The DDD structure suppresses the hot electron effect caused by the short channel of the MOS transistor to further avoid electrical breakdown of the source/drain under high operational voltages. The LDMOS transistors are particularly prevalent because they can operate with a high efficiency and their planar structure allows for easy integration on a semiconductor die with other circuitry.

The IGBT is a power semiconductor device having both a high speed switching property of a power MOSFET and a high output property of a bipolar transistor. For this reason, the IGBT devices are frequently used in the field of power electronics, such as an inverter, a switching power supply, or the like. Among the IGBTs, a lateral IGBT draws attention, since it is suitable for a high degree of integration level. Typically, the lateral IGBT is formed, using an SOI substrate, which requires extra masks and is thus more expensive.

It would be desirable in this industry to provide a power semiconductor device that integrates LDMOS with a lateral IGBT, which is CMOS compatible and employs bulk silicon substrate.

SUMMARY OF THE INVENTION

An object of the present invention is to provide a CMOS-compatible power semiconductor device having an integrated lateral IGBT employing bulk silicon substrate.

To these ends, according to one aspect of the present invention, there is provided a power semiconductor device including a P type silicon substrate; a deep N well in the P type silicon substrate; a P grade region in the deep N well; a P$^+$ drain region in the P grade region; a first shallow trench isolation (STI) region in the P grade region; a second STI region in the P grade region, wherein the first and second STI region isolate the P$^+$ drain region; a third STI region in the deep N well; a gate electrode overlying an area between the second and third STI regions and covering a portion of the second STI region; a gate dielectric layer between the gate electrode and the P type silicon substrate; a P well formed at one side of the third STI region that is opposite to the gate electrode; and a P$^+$ source region in the P well.

From one aspect of the present invention, a power semiconductor device includes a P type silicon substrate; a deep N well in the P type silicon substrate; a P grade region in the deep N well; a P$^+$ drain region in the P grade region; a first shallow trench isolation (STI) region in the P grade region; a second STI region in the P grade region, wherein the first and second STI region isolate the P$^+$ drain region; a first peripheral STI region in the deep N well; a first gate electrode overlying at least a portion of the deep N well and at least a portion of the P grade region between the first peripheral STI region and the first STI region and the first gate electrode covering a portion of the first STI region; a first gate dielectric layer between the first gate electrode and the P type silicon substrate; a second peripheral STI region in the deep N well; a second gate electrode overlying at least a portion of the deep N well and at least a portion of the P grade region between the second peripheral STI region and the second STI region and the second gate electrode covering a portion of the second STI region; a source region provided in the deep N well between the first peripheral STI region and the first gate electrode; a first P well formed at one side of the second peripheral STI region that is opposite to the second gate electrode; and a first P$^+$ source region in the P well.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
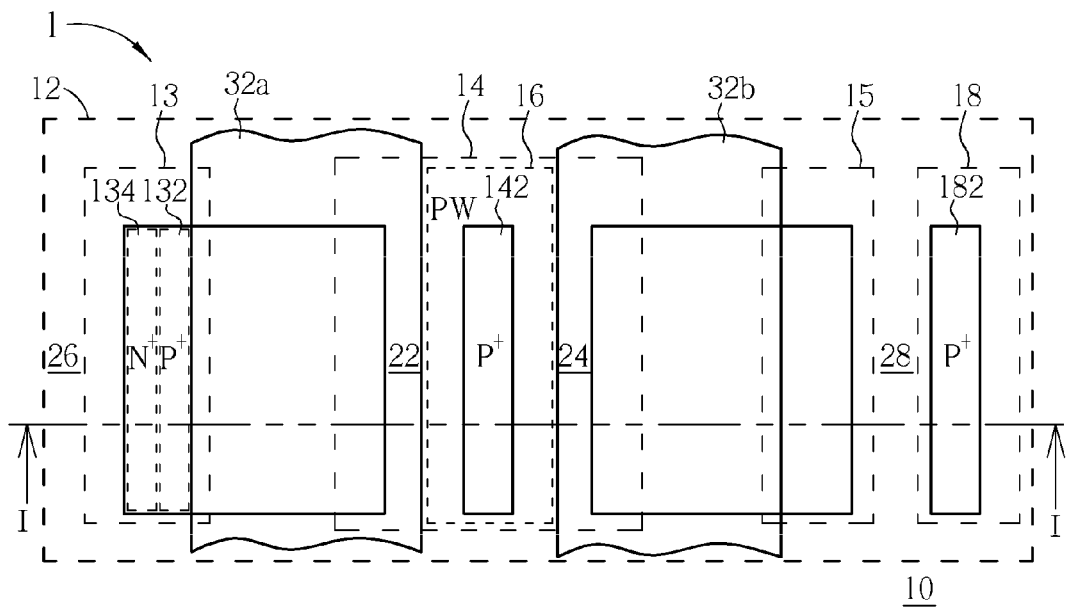
FIG. 1 is a schematic diagram showing the layout of the power semiconductor device having an integrated lateral IGBT in accordance with one preferred embodiment of this invention.

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

One or more implementations of the present invention will now be described with reference to the attached drawings, wherein like reference numerals are used to refer to like elements throughout, and wherein the illustrated structures are not necessarily drawn to scale.

Figure 2:
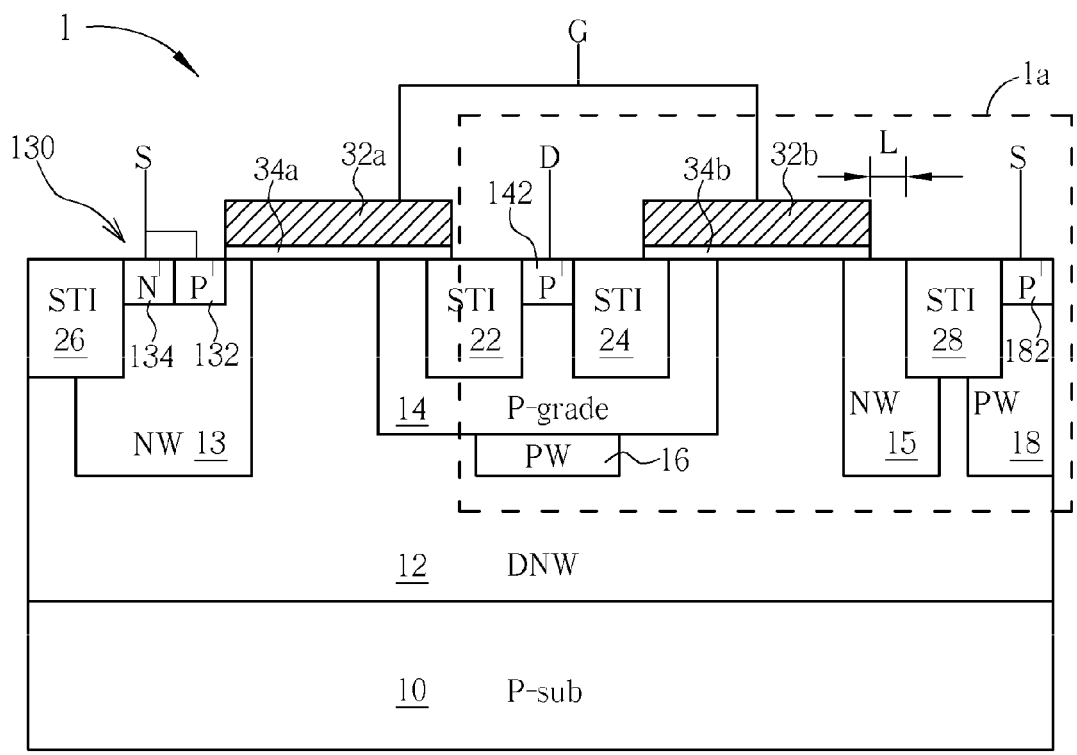
FIG. 2 is a schematic, cross-sectional diagram taken along line I-I' of FIG. 1.

Please refer to FIG. 1 and FIG. 2. FIG. 1 is a schematic diagram showing the layout of the power semiconductor device 1 having an integrated lateral IGBT in accordance with one preferred embodiment of this invention. FIG. 2 is a schematic, cross-sectional diagram taken along line I-I' of FIG. 1.

As shown in FIG. 1 and FIG. 2, the power semiconductor device 1 is formed in a P type silicon substrate 10. Two space-apart gate electrodes 32a and 32b are formed on the P substrate 10. The gate electrodes 32a and 32b may be electrically connected to each other. Gate dielectric layers 34a and 34b are provided between respective gate electrodes 32a and 32b and the P type silicon substrate 10. A deep N well 12 is formed in the P type silicon substrate 10.

A P grade region 14 is provided in the deep N well 12. Optionally, a P well 16 may be formed under the P grade region 14. A shallow trench isolation (STI) region 22 and an STI region 24 is formed in the P grade region 14. The STI regions 22 and 24 isolate a P$^+$ drain region 142 that is formed in the P grade region 14. The P$^+$ drain region 142 is disposed approximately at the midpoint between gate electrodes 32a and 32b. According to the preferred embodiment, STI region 22 is provided between the P$^+$ drain region 142 and the gate electrode 32a and the STI region 24 is provided between the P$^+$ drain region 142 and the gate electrode 32b. The gate electrode 32a laterally extends to the STI region 22 and covers a portion of the STI region 22, while the gate electrode 32b laterally extends to the STI region 24 and covers a portion of the STI region 24.

The power semiconductor device 1 further comprises peripheral STI regions 26 and 28 provided for isolating the power semiconductor device 1. On one side of the gate electrode 32a that is opposite to the P$^+$ drain region 142, a source region 130 is provided in the deep N well 12 between the peripheral STI region 26 and the gate electrode 32a. According to the preferred embodiment, the source region 130 comprises a P$^+$ source region 132 adjacent to the gate electrode 32a and an N$^+$ region 134 butting on the P$^+$ source region 132. The source region 130 further comprise an N well 13 encompassing the butting P$^+$ source region 132 and N$^+$ region 134.

On one side of the gate electrode 32b that is opposite to the P$^+$ drain region 142, an N well 15 is formed in the deep N well 12 between the gate electrode 32b and the peripheral STI region 28. The N well 15 extends to a portion of the deep N well 12 that is underneath the peripheral STI region 28. It is noteworthy that the gate electrode 32b does not cover the STI region 28. A P well 18 is formed at one side of the peripheral STI region 28 that is opposite to the N well 15. The P well 18 extends to a portion of the deep N well 12 that is underneath the peripheral STI region 28. A P$^+$ source region 182 is formed in the P well 18. The P$^+$ source region 182 also acts as the collector of a lateral PNP IGBT 1a that is specifically indicated by dotted line.

According to the preferred embodiment of this invention, the lateral PNP IGBT 1a comprises the P$^+$ drain region 142, the STI region 22 and STI region 24 that isolate the P$^+$ drain region 142, the P grade region 14 encompassing the P$^+$ drain region 142, the STI region 22 and STI region 24, the P well 16 under the P grade region 14, the gate electrode 32b overlying a portion of the STI region 24, the gate dielectric layer 34b, the N well 15 at one side of the gate electrode 32b opposite to the STI region 24, the peripheral STI region 28, the P$^+$ source region 182 and P well 18 at one side of the peripheral STI region 28 opposite to the N well 15. The P$^+$ drain region 142 acts as the emitter of the lateral PNP IGBT 1a, and the deep N well 12 acts as the base of the lateral PNP IGBT 1a. The power semiconductor device 1 that integrates LDMOS with a lateral PNP IGBT 1a. The power semiconductor device 1 is CMOS compatible and employs bulk silicon substrate.

Figure 3:
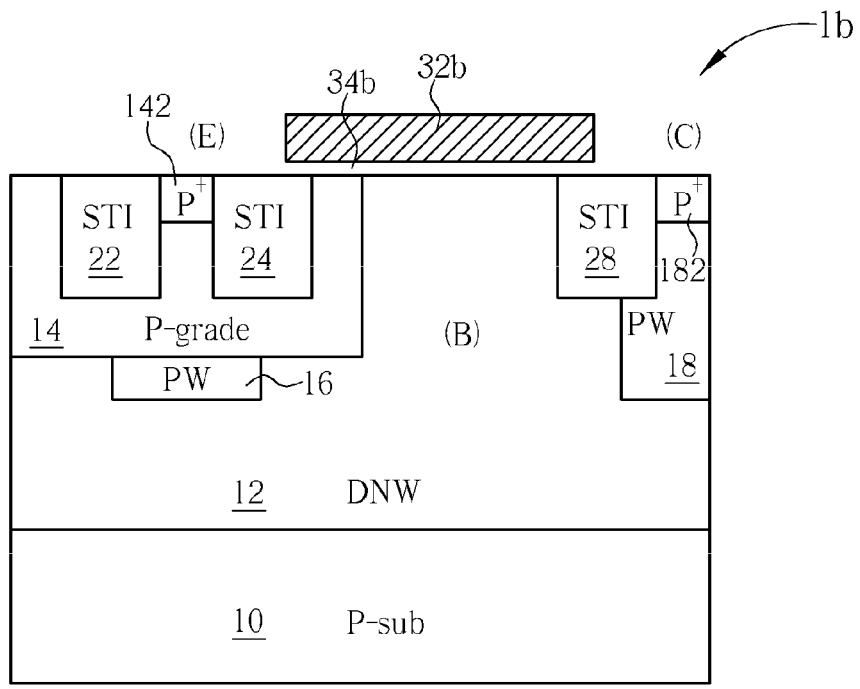
FIG. 3 is a schematic, cross-sectional view showing a germane portion of a lateral PNP IGBT in accordance with another preferred embodiment of this invention.

FIG. 3 is a schematic, cross-sectional view showing a germane portion of a lateral PNP IGBT 1b in accordance with another preferred embodiment of this invention. As shown in FIG. 3, likewise, the lateral PNP IGBT 1b is formed in the deep N well 12 of the P type silicon substrate 10. The lateral PNP IGBT 1b comprises the P$^+$ drain region 142, the STI region 22 and STI region 24 that isolate the P$^+$ drain region 142, the P grade region 14 encompassing the P$^+$ drain region 142, the STI region 22 and STI region 24, the P well 16 under the P grade region 14, the gate electrode 32b, the gate dielectric layer 34b, the STI region 28, the P$^+$ source region 182 and P well 18 at one side of the STI region 28 opposite to the gate electrode 32b. The P$^+$ drain region 142 acts as the emitter of the lateral PNP IGBT 1b, the P$^+$ source region 182 also acts as the collector, and the deep N well 12 acts as the base of the lateral PNP IGBT 1b.

The differences between the lateral PNP IGBT 1b and the lateral PNP IGBT 1a of FIG. 2 include: (1) the gate electrode 32b overlies a portion of the STI region 28; and (2) the N well 15 of the lateral PNP IGBT 1a of FIG. 2 is omitted.

Figure 4:
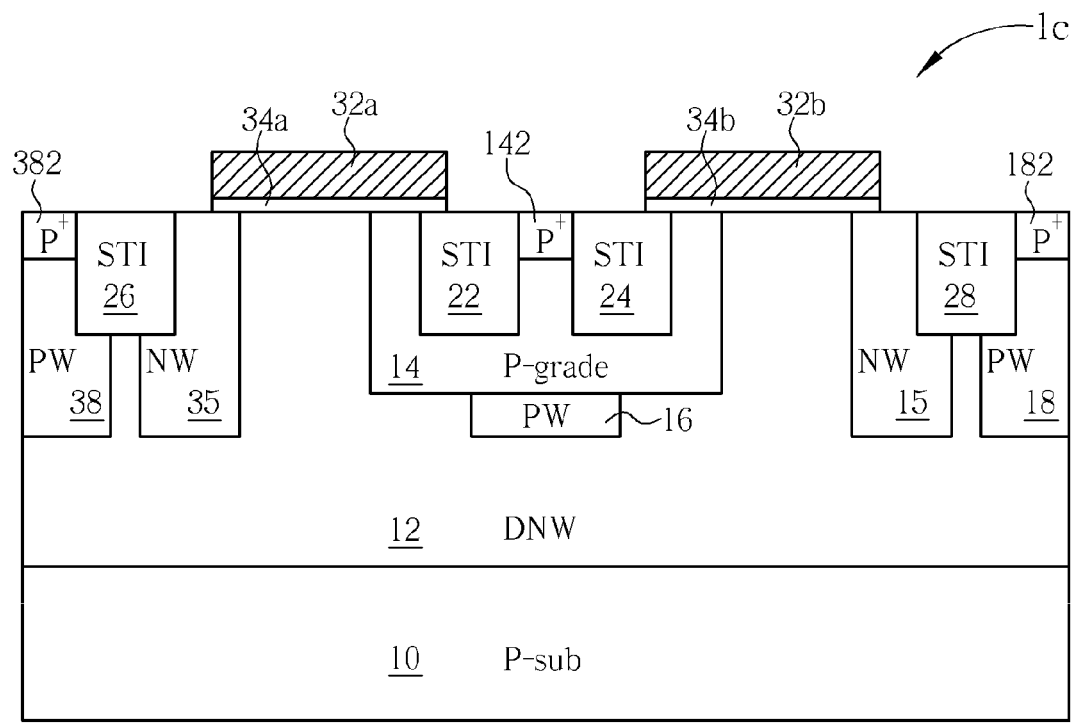
FIG. 4 is a schematic, cross-sectional view showing a lateral PNP IGBT in accordance with yet another preferred embodiment of this invention.

FIG. 4 is a schematic, cross-sectional view showing a lateral PNP IGBT 1c in accordance with another preferred embodiment of this invention. As shown in FIG. 4, the lateral PNP IGBT 1c is a symmetric structure formed in the deep N well 12 of the P type silicon substrate 10. The lateral PNP IGBT 1c comprises the P$^+$ drain region 142, the STI region 22 and STI region 24 that isolate the P$^+$ drain region 142, the P grade region 14 encompassing the P$^+$ drain region 142, STI region 22 and STI region 24, the P well 16 under the P grade region 14, the gate electrodes 32a and 32b, the gate dielectric layer 34a and 34b, and the peripheral STI regions 26 and 28.

On one side of the gate electrode 32b that is opposite to the P$^+$ drain region 142, an N well 15 is formed in the deep N well 12 between the gate electrodes 32b and the peripheral STI region 28. The N well 15 extends to a portion of the deep N well 12 that is underneath the peripheral STI region 28. It is noteworthy that the gate electrode 32b does not cover the peripheral STI region 28. A P well 18 is formed at one side of the peripheral STI region 28 that is opposite to the N well 15. The P well 18 may extend to a portion of the deep N well 12 that is underneath the peripheral STI region 28. A P$^+$ source region 182 is formed in the P well 18.

On one side of the gate electrode 32a that is opposite to the P$^+$ drain region 142, an N well 35 is formed in the deep N well 12 between the gate electrodes 32a and the peripheral STI region 26. The N well 35 extends to a portion of the deep N well 12 that is underneath the peripheral STI region 26. The gate electrode 32a does not cover the peripheral STI region 26. A P well 38 is formed at one side of the peripheral STI region 26 that is opposite to the N well 35. The P well 38 may extend to a portion of the deep N well 12 that is underneath the peripheral STI region 26. A P$^+$ source region 382 is formed in the P well 38.

Those skilled in the art will readily observe that numerous modifications and alterations of the device and method may be made while retaining the teachings of the invention.

What is claimed is:

1. A power semiconductor device, comprising:
   a P type silicon substrate;
   a deep N well in the P type silicon substrate;
   a P grade region in the deep N well;
   a P$^+$ drain region in the P grade region;
   a first shallow trench isolation (STI) region in the P grade region;
   a second STI region in the P grade region, wherein the first and second STI region isolate the P$^+$ drain region;
   a third STI region in the deep N well;
   a gate electrode overlying an area between the second and third STI regions and covering a portion of the second STI region;

a gate dielectric layer between the gate electrode and the P type silicon substrate;

a first P well formed at one side of the third STI region that is opposite to the gate electrode; and a $P^+$ source region in the first P well.

2. The power semiconductor device according to claim 1 wherein an N well is formed in the deep N well between the gate electrode and the third STI region.

3. The power semiconductor device according to claim 1 wherein a second P well is provided under the P grade region.

4. The power semiconductor device according to claim 1 wherein the $P^+$ drain region acts as an emitter of a lateral insulated gate bipolar transistor.

5. The power semiconductor device according to claim 4 wherein the $P^+$ source region acts as a collector of the lateral insulated gate bipolar transistor.

6. The power semiconductor device according to claim 4 wherein the lateral insulated gate bipolar transistor is a lateral PNP insulated gate bipolar transistor.

7. The power semiconductor device according to claim 1 wherein the gate electrode covers a portion of the third STI region.

8. A power semiconductor device, comprising:

a P type silicon substrate;

a deep N well in the P type silicon substrate;

a P grade region in the deep N well;

a $P^+$ drain region in the P grade region;

a first shallow trench isolation (STI) region in the P grade region;

a second STI region in the P grade region, wherein the first and second STI region isolate the $P^+$ drain region;

a first peripheral STI region in the deep N well;

a first gate electrode overlying at least a portion of the deep N well and at least a portion of the P grade region between the first peripheral STI region and the first STI region and the first gate electrode covering a portion of the first STI region;

a first gate dielectric layer between the first gate electrode and the P type silicon substrate;

a second peripheral STI region in the deep N well;

a second gate electrode overlying at least a portion of the deep N well and at least a portion of the P grade region between the second peripheral STI region and the second STI region and the second gate electrode covering a portion of the second STI region;

a second gate dielectric layer between the second gate electrode and the P type silicon substrate;

a source region provided in the deep N well between the first peripheral STI region and the first gate electrode;

a first P well formed at one side of the second peripheral STI region that is opposite to the second gate electrode; and a first $P^+$ source region in the first P well.

9. The power semiconductor device according to claim 8 wherein the source region comprises a second $P^+$ source region adjacent to the first gate electrode and an $N^+$ region butting on the second $P^+$ source region.

10. The power semiconductor device according to claim 9 wherein the second $P^+$ source region and the $N^+$ region are formed in a first N well.

11. The power semiconductor device according to claim 10 wherein first gate electrode overlies a portion of the first N well.

12. The power semiconductor device according to claim 8 wherein the first gate electrode and the second gate electrode are electrically connected to each other.

13. The power semiconductor device according to claim 8 wherein a second N well is formed in the deep N well between the second gate electrode and the second peripheral STI region.

14. The power semiconductor device according to claim 8 wherein a second P well is provided under the P grade region.

15. The power semiconductor device according to claim 8 wherein the $P^+$ drain region acts as an emitter of a lateral insulated gate bipolar transistor.

16. The power semiconductor device according to claim 15 wherein the first $P^+$ source region acts as a collector of the lateral insulated gate bipolar transistor.

17. The power semiconductor device according to claim 15 wherein the lateral insulated gate bipolar transistor is a lateral PNP insulated gate bipolar transistor.

* * * * *